US012288670B2

(12) United States Patent
Sangle et al.

(10) Patent No.: US 12,288,670 B2
(45) Date of Patent: Apr. 29, 2025

(54) PULSED DC POWER FOR DEPOSITION OF FILM

(71) Applicant: Applied Materials, Inc., Santa Clara, CA (US)

(72) Inventors: Abhijeet Laxman Sangle, Maharashtra (IN); Nilesh Patil, Dist Thane (IN); Vijay Bhan Sharma, Rajasthan (IN); Visweswaren Sivaramakrishnan, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/684,911

(22) Filed: Mar. 2, 2022

(65) Prior Publication Data
US 2022/0285129 A1    Sep. 8, 2022

Related U.S. Application Data

(60) Provisional application No. 63/155,604, filed on Mar. 2, 2021.

(51) Int. Cl.
*C23C 14/34* (2006.01)
*C23C 14/08* (2006.01)
(Continued)

(52) U.S. Cl.
CPC ...... *H01J 37/32064* (2013.01); *C23C 14/081* (2013.01); *C23C 14/083* (2013.01);
(Continued)

(58) Field of Classification Search
CPC ............ H01J 37/32064; H01J 37/3426; H01J 21/02178; H01J 21/02194;
(Continued)

(56) References Cited

U.S. PATENT DOCUMENTS 5,015,493 A * 5/1991 Gruen ............... C23C 14/32
427/571
6,455,326 B1 * 9/2002 Eastep ............... C23C 14/34
257/295

(Continued)

FOREIGN PATENT DOCUMENTS

| CN | 105 506 549 A | * | 4/2016 |
| WO | 0038213 A2 | | 6/2000 |
| WO | 2018206100 A1 | | 11/2018 |

OTHER PUBLICATIONS

Macine Translation CN 105506549 (Year: 2016).*

(Continued)

*Primary Examiner* — Rodney G McDonald
(74) *Attorney, Agent, or Firm* — Servilla Whitney LLC

(57) ABSTRACT

A vapor deposition system and methods of operation thereof are disclosed. The vapor deposition system includes a vacuum chamber; a dielectric target within the vacuum chamber, the dielectric target having a front surface and a thickness; a substrate support within the vacuum chamber, the substrate support having a front surface spaced from the front surface of the dielectric target to form a process gap; and a signal generator connected to the dielectric target to generate a plasma in the vacuum chamber, the signal generator comprises a power source, the power source configured to prevent charge accumulation in the dielectric target. The method includes applying power to a dielectric target within a vacuum chamber to generate a plasma in a process gap between the dielectric target and a substrate support and pulsing the power applied to the dielectric target to prevent charge accumulation.

10 Claims, 2 Drawing Sheets

(51) Int. Cl.
   *H01J 37/32*   (2006.01)
   *H01J 37/34*   (2006.01)
   *H01L 21/02*   (2006.01)

(52) U.S. Cl.
   CPC ...... *C23C 14/3485* (2013.01); *H01J 37/3426* (2013.01); *H01J 2237/332* (2013.01); *H01L 21/02178* (2013.01); *H01L 21/02194* (2013.01); *H01L 21/02197* (2013.01); *H01L 21/02266* (2013.01)

(58) Field of Classification Search
   CPC .......... H01J 21/02197; H01J 21/02266; H01J 21/02192; H01J 21/67; C23C 14/081; C23C 14/083; C23C 14/3485; H01L 21/02178; H01L 21/02194; H01L 21/02197; H01L 21/02266; H01L 21/02192; H01L 21/67
   USPC .......................... 204/298.06, 298.08, 192.22
   See application file for complete search history.

(56) References Cited

U.S. PATENT DOCUMENTS

| | | |
|---|---|---|
| 7,544,276 B2 | 6/2009 | Zhang et al. |
| 8,105,466 B2 | 1/2012 | Zhang et al. |
| 2004/0094402 A1 | 5/2004 | Gopalraja et al. |
| 2015/0315698 A1 | 11/2015 | Chistyakov |
| 2019/0127842 A1 | 5/2019 | Babayan et al. |

OTHER PUBLICATIONS

Eom et al., "Effects of the Duty Ratio on the Niobium Oxide Film Deposited by Pulsed-DC Magnetron Sputtering Methods", Journal of Nanoscience and Nanotechnology, vol. 13, 7760-7765, 2013 (Year: 2013).*
Foster "Crystallographic Orientation of Zinc Oxide Films Deposited by Triode Sputtering", J. Vac. Sci. Tech. (Aug. 1968), pp. 111-114 ( Year: 1968).*
Belkind, A., et al., "Characterization of Pulsed DC Magnetron Sputtering Plasmas", New Journal of Physics 7 (2005) 90, 17 pages.
Belkind, A., et al., "Pulsed-DC Reactive Sputtering of Dielectrics: Pulsing Parameter Effects", 2000 Society of Vacuum Coaters 505/856-7188, 43rd Annual Technical Conference Proceedings, pp. 86-90.
Belkind, A., et al., "Using Pulsed Direct Current Power for Reactive Sputtering of Al2O3", J. Vac. Sci. Technol. A 17 (4), Jul./Aug. 1999, pp. 1934-1940.
Bhaisare, Meenakshi, et al., "Effect of Power Density on the Passivation Quality of Pulsed-DC Reactive Sputtered Aluminum oxide on P-type Crystalline Silicon", Conference Record of the IEEE Photovoltaic Specialists Conference—Jun. 2013, 6 pages.
Carter, D., et al., "Parameter Optimization in Pulsed DC Reactive Sputter Deposition of Aluminum Oxide", 2002 Society of Vacuum Coaters, 505/856-7188, 45th Annual Technical Conference Proceedings (2002), pp. 570-577.
Freilich, A., et al., "Substrate Biasing in Pulsed DC Reactive Sputtering of Dielectrics", 2003 Society of Vacuum Coaters 505/856-7188, 46th Annual Technical Conference Proceedings, pp. 40-45.
PCT International Search Report and Written Opinion in PCT/US2022/018490 dated Jun. 17, 2022, 11 pages.

* cited by examiner

PULSED DC POWER FOR DEPOSITION OF FILM

CROSS-REFERENCE TO RELATED APPLICATION

This application claims priority to U.S. Provisional Application No. 63/155,604, filed Mar. 2, 2021, the entire disclosure of which is hereby incorporated by reference herein.

TECHNICAL FIELD

Embodiments of the disclosure generally relate to methods for depositing a film on a substrate. In particular, embodiments of the disclosure are directed to methods of depositing a dielectric film on a substrate.

BACKGROUND

Sputtering, alternatively called physical vapor deposition (PVD), has long been used for the deposition of metals and related materials in the fabrication of semiconductor integrated circuits. Use of sputtering has been extended to depositing metal layers onto the sidewalls of high aspect-ratio holes such as vias or other vertical interconnect structures, as well as in the manufacture of extreme ultraviolet (EUV) mask blanks. In the manufacture of EUV mask blanks minimization of particle generation is desired, because particles negatively affect the properties of the final product.

Plasma sputtering may be accomplished using either DC sputtering or RF sputtering. Plasma sputtering typically includes a magnetron positioned at the back of the sputtering target including two magnets of opposing poles magnetically coupled at their back through a magnetic yoke to project a magnetic field into the processing space to increase the density of the plasma and enhance the sputtering rate from a front face of the target. Magnets used in the magnetron are typically closed loop for DC sputtering and open loop for RF sputtering.

In plasma enhanced substrate processing systems, such as physical vapor deposition (PVD) chambers, high power density PVD sputtering with high magnetic fields and high DC power can produce high energy at a sputtering target, and cause a large rise in surface temperature of the sputtering target. The sputtering target is cooled by contacting a target backing plate with cooling fluid. In plasma sputtering as typically practiced commercially, a target of the material to be sputter deposited is sealed to a vacuum chamber containing the substrate to be coated. Argon is admitted to the chamber. When a negative DC bias of several hundred volts is applied to target while the chamber walls or shields remain grounded, the argon is excited into a plasma. The positively charged argon ions are attracted to the negatively biased target at high energy and sputter target atoms from the target.

While advancements in PVD chamber design have been made, there remains a need of method depositing dielectric film and preventing excessive charge accumulation on dielectric target.

SUMMARY

One or more embodiments of the disclosure are directed to a vapor deposition apparatus. In one or more embodiments, the vapor deposition apparatus comprises a vacuum chamber, a dielectric target within the vacuum chamber, a substrate support within the vacuum chamber, and a signal generator connected to the dielectric target to generate a plasma in the vacuum chamber. In some embodiments, the dielectric target has a front surface and a thickness. In some embodiments, the substrate support has a front surface spaced from the front surface of the dielectric target to form a process gap. In some embodiments, the signal generator is configured to prevent charge accumulation in the dielectric target.

Another embodiment of the disclosure is directed to a method of depositing a dielectric film. In some embodiments, the method comprises applying power to a dielectric target within a vacuum chamber to generate a plasma in a process gap between the dielectric target and a substrate support, and pulsing the power applied to the dielectric target to prevent charge accumulation.

BRIEF DESCRIPTION OF THE DRAWINGS

So that the manner in which the above recited features of embodiments of the disclosure can be understood in detail, a more particular description of embodiments of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus, for example, where a film/layer or partial film/layer has been deposited onto a substrate surface, the exposed surface of the newly deposited film/layer becomes the substrate surface.

Embodiments of the disclosure generally relate to methods and apparatus for depositing a film using a physical vapor deposition (PVD) process. According to some embodiments of the disclosure, a PVD film comprises a dielectric film.

Figure 1:
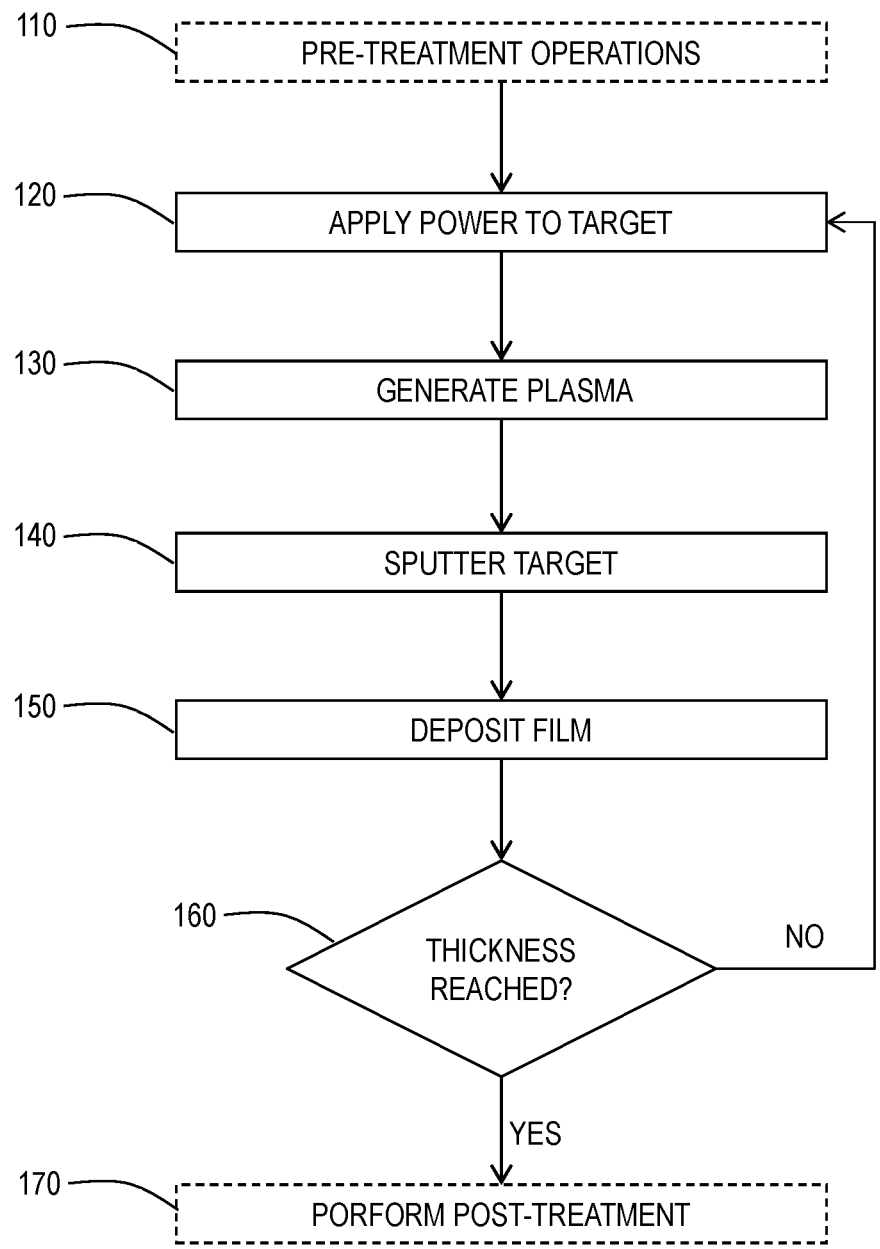
FIG. 1 shows a process flow diagram of a method in accordance with one or more embodiments of the disclosure.

FIG. 1 describes an exemplary method 100 for depositing a film. In some embodiments, the method comprises a vapor deposition method. In some embodiments, the vapor deposition method comprises a physical vapor deposition (PVD) process or a variant thereof.

In one or more embodiments, the method 100 includes an optional pre-treatment operation 110. During the pre-treatment, a substrate is treated with any suitable pre-treatment known to the skilled artisan. Suitable pre-treatments include, but are not limited to, pre-heating, cleaning, soaking, native oxide removal, or deposition of an adhesion layer and/or barrier layer.

Some embodiments of the disclosure are directed to apparatus for depositing a film. In some embodiments, the physical vapor deposition process is performed in any suitable apparatus. In some embodiments, the suitable apparatus comprises a physical vapor deposition system.

In some embodiments, the physical vapor deposition system comprises a vacuum deposition system. In some embodiments, the vacuum deposition system is configured for magnetron sputtering, ion sputtering, pulsed laser deposition, cathode arc deposition, or a combination thereof. In some embodiments, the vacuum deposition system comprises a magnetron sputtering system configured to form a film on the substrate by magnetron sputtering.

In some embodiments, a variety of dielectric films can be deposited with a suitable target in the same chamber configuration. In some embodiments, the methods are performed in existing deposition chambers. Accordingly, embodiments of the disclosure advantageously provide methods that are versatile and do not require changing hardware to control target bias through anode/cathode area ratio tuning.

Figure 2:
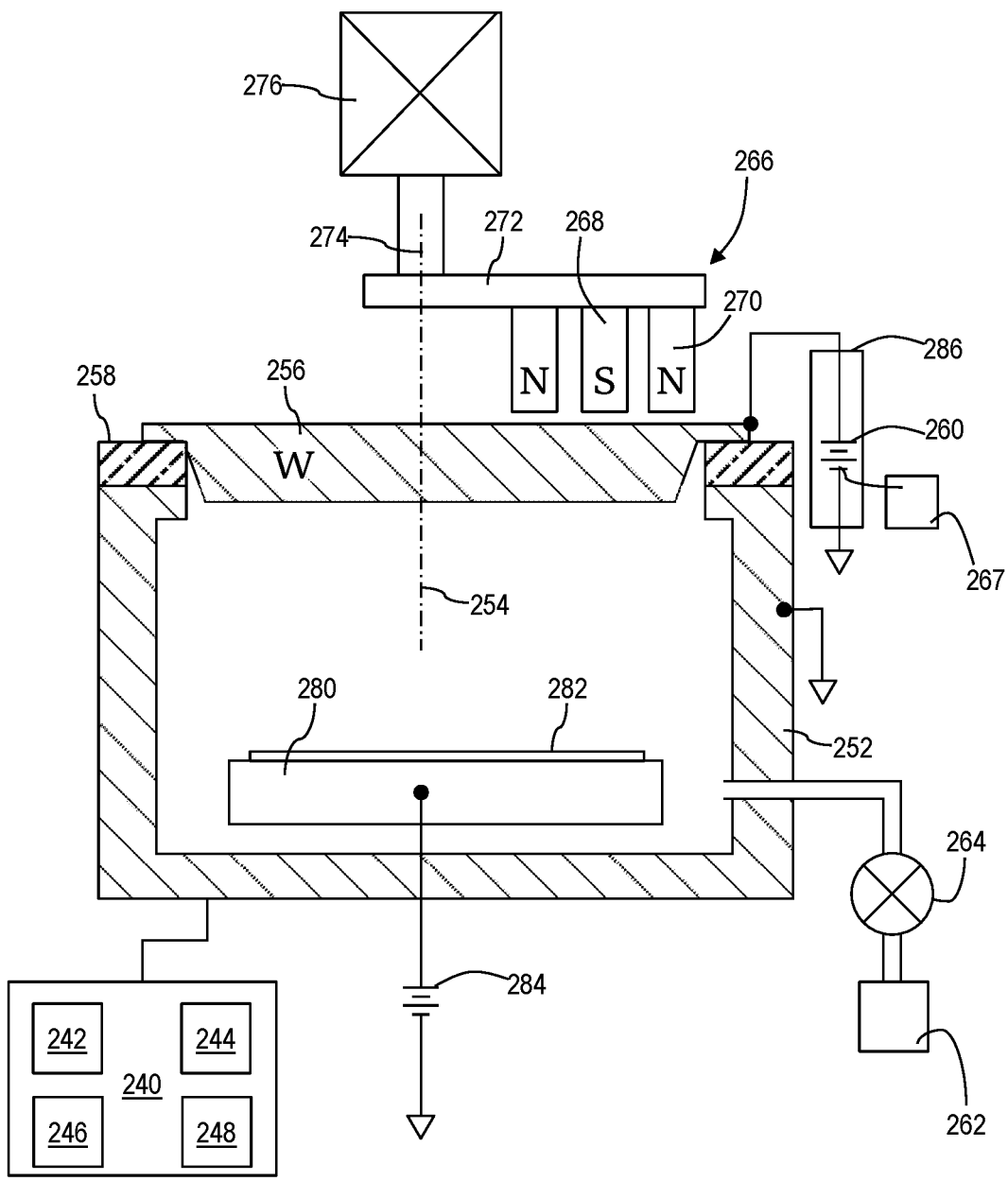
FIG. 2 illustrates a schematic cross-sectional view of a physical vapor deposition (PVD) chamber in accordance with one or more embodiments of the disclosure.

An exemplary physical vapor deposition system 200, useful for the methods of one or more embodiments, is illustrated in FIG. 2. The physical vapor deposition system 200 comprises a vacuum chamber 252, a target 256 within the vacuum chamber 252, a substrate support 280 within the vacuum chamber 252 and a signal generator 286 connected to the target 256.

The vacuum chamber 252 is arranged about a central axis 254 on which the target 256 is supported through an isolator 258, which vacuum seals the target 256 to the vacuum chamber 252. The isolator 258 electrically isolates the target 256 from the electrically grounded vacuum chamber 252. A vacuum pump system (not shown) pumps the interior of the vacuum chamber 252 to a pressure in the low milliTorr range. In some embodiments, the vacuum chamber 252 has a pressure in a range of from 1 milliTorr to 30 milliTorr, from 5 milliTorr to 30 milliTorr, from 10 milliTorr to 30 milliTorr, from 20 milliTorr to 30 milliTorr, from 1 milliTorr to 20 milliTorr, from 5 milliTorr to 20 milliTorr, from 10 milliTorr to 20 milliTorr, from 1 milliTorr to 10 milliTorr, from 5 milliTorr to 10 milliTorr or from 1 milliTorr to 5 milliTorr.

In one or more embodiments, the shape of the front surface of the target 256 can be planar or generally concave with thicker outer peripheral edges than inner diameter portions. The target 256 includes a layer of material facing the interior of the vacuum chamber 252 and which typically contains no more than 5 atomic % of elements other than the material to be deposited to provide a source of sputtered material.

The signal generator 286 comprises a power source 260. In some embodiments, the signal generator 286 further comprises a waveform generator 267 operatively connected to the power source 260. In some embodiments, the signal generator 286 applies power to bias the target 256. In some embodiments, the power source 260 comprises a DC power source. In some embodiments, the DC power source biases the target with respect to the grounded vacuum chamber 252 or grounded sidewall shield (not shown) to excite a plasma gas into a plasma. In some embodiments, the target 256 is more negatively biased than the vacuum chamber 252 or sidewall shield (not shown).

At 120 in FIG. 1, the method 100 comprises applying a power to the target 256. In some embodiments, the power comprises a DC power. In some embodiments, the target 256 comprises dielectric target.

Without being bound by any specific theory of operation, it is believed that simple DC sputtering of dielectrics is not possible due to insulating nature of the target. The nature of the target 256 results in accumulation of charges on the target surface to produce high potential build-up between target surface, chamber walls and/or substrate. The arc can damage the film, substrate, vacuum chamber components and/or power supply.

A reactive pulsed DC sputtering may be considered as a type of alternating current (AC) sputtering with not necessarily equal positive and negative half cycles and having a square waveform instead of sinusoidal. Reactive pulsed DC sputtering uses alloy targets. However, reactive pulsed DC sputtering from alloy targets is difficult for stoichiometry control. Whereas, depositing using RF sputter deposition from compound targets can be difficult to control too, especially where precise control of target bias, film properties, etc. is required due to the difficulty in tuning RF plasma. Thus, there is need to provide apparatus and methods to achieve the stoichiometry close to a desired range The present disclosure describes embodiments of method 100, the method 100 comprises using pulsed DC waveform, wherein the ON and OFF voltage and/or duty cycles are independently controlled depending upon the impedance of the target and chamber geometry. In one or more embodiments, the disclosure provides methods of using dielectric targets and pulsed DC sputtering to produce a waveform. In some embodiments, the waveform is shaped by one or more of a voltage, a duty cycle or a frequency.

In some embodiments, a pulsing power is applied to the target 256. In some embodiments, the pulsing power comprises a pulsing DC power. In some embodiments, the target 256 is being applied the pulsing DC power. In some embodiments, the dielectric target comprises lead zirconate titanate (PZT), lead magnesium niobate-lead titanate (PMN-PT), aluminium oxide ($Al_2O_3$), lithium niobate ($LiNbO_3$) or combination thereof. In some embodiments, the target 256 can be any suitable dielectric material known to one skilled in the art.

In some embodiments, the target 256 is maintained at a temperature in a range of from 0° C. to 60° C., from 20° C. to 60° C., from 40° C. to 60° C., from 0° C. to 40° C., from 20° C. to 40° C. or from 0° C. to 20° C.

Referring back to FIG. 2, in one or more embodiments, the signal generator 286 is configured to generate the pulsing DC power. In some embodiments, the pulsing DC power comprises a pulsed DC waveform. In some embodiments, the signal generator 286 is configured to prevent charge accumulation. In some embodiments, the pulsed DC waveform is generated at a frequency in a range of from 10 kHz to 500 kHz, from 50 kHz to 500 kHz, from 100 kHz to 500 kHz, from 250 kHz to 500 kHz, from 10 kHz to 250 kHz, from 50 kHz to 250 kHz, from 100 kHz to 250 kHz, from 10 kHz to 100 kHz, from 50 kHz to 100 kHz or from 10 kHz to 50 kHz. In some embodiments, the pulsed DC waveform has a duty cycle in a range of from greater than 0 to 0.6, from greater than 0 to 0.5, from greater than 0 to 0.4, from greater than 0 to 0.3, from greater than 0 to 0.2 or from greater than 0 to 0.1. In some embodiments, the pulsed DC waveform has a duty cycle in a range of from greater than 0 to less than 0.6, from greater than 0 to less than 0.5, from greater than 0 to less than 0.4, from greater than 0 to less than 0.3, from greater than 0 to less than 0.2 or from greater than 0 to less than 0.1. In some embodiments, the pulsed DC waveform comprises a plurality of ON pulses and OFF pulses. In some embodiments, each of the ON pulses has ON time. In some embodiments, each of the OFF pulses has OFF time.

In some embodiments, the pulsed DC power has an ON voltage and an OFF voltage. In some embodiments, the ON voltage is in a range of from greater than 9 V to 1500 V, from greater than 10 V to 1500 V, from greater than 50 V to 1500 V, from greater than 100 V to 1500 V, from greater than 500 V to 1500 V or from greater than 1000 V to 1500 V.

In some embodiments, the pulsed DC waveform has an ON time and an OFF time. In some embodiments, each of the ON time and the OFF time independently having in a range of from 1 μs to 50 μs, from 10 μs to 50 μs, from 25 μs to 50 μs, from 1 μs to 25 μs, from 10 μs to 25 μs or from 1 μs to 10 μs.

In some embodiments, the waveform generator 267 produces independently equal positive or negative half cycles. In some embodiments, the waveform generator 267 produces independently unequal negative half cycles. In some embodiments, the waveform generator 267 produces a square waveform. In some embodiments, the waveform generator 267 does not produce sinusoidal waveform.

At 130, the power supplied by the DC power source 260 to the target 256 excites the plasma processing gas into a plasma. In some embodiments, the plasma is generated in a process gap. The process gap is a gap between the target 256 and the substrate support 280. The plasma comprises positively charged ions of the plasma gas. In some embodiments, the plasma gas is supplied in the vacuum chamber 252 from a gas source 262 through a mass flow controller 264. In some embodiments, the plasma gas is supplied in a range of from 2 sccm to 100 sccm, from 20 sccm to 100 sccm, from 50 sccm to 100 sccm, from 75 sccm to 100 sccm, from 2 sccm to 75 sccm, from 20 sccm to 75 sccm, from 50 sccm to 75 sccm, from 2 sccm to 50 sccm, from 20 sccm to 50 sccm or from 2 sccm to 20 sccm. In some embodiments, the plasma gas maintains a pressure inside the vacuum chamber 252. In some embodiments, the plasma gas maintains a pressure inside the vacuum chamber 252 in a range of from 1 milliTorr to 30 milliTorr, from 5 milliTorr to 30 milliTorr, from 10 milliTorr to 30 milliTorr, from 20 milliTorr to 30 milliTorr, from 1 milliTorr to 20 milliTorr, from 5 milliTorr to 20 milliTorr, from 10 milliTorr to 20 milliTorr, from 1 milliTorr to 10 milliTorr, from 5 milliTorr to 10 milliTorr or from 1 milliTorr to 5 milliTorr. In some embodiments, the substrate support 280 is maintained at a temperature in a range of from 15° C. to 1000° C., from 50° C. to 1000° C., from 100° C. to 1000° C., from 250° C. to 1000° C., from 500° C. to 1000° C., from 750° C. to 1000° C., from 15° C. to 750° C., from 50° C. to 750° C., from 100° C. to 750° C., from 250° C. to 750° C., from 500° C. to 750° C., from 15° C. to 500° C., from 50° C. to 500° C., from 100° C. to 500° C., from 250° C. to 500° C., from 15° C. to 250° C., from 50° C. to 250° C., from 100° C. to 250° C., from 15° C. to 100° C., from 50° C. to 100° C. or from 15° C. to 50° C.

In one or more embodiments, the plasma gas comprises one or more of helium (He), neon (Ne), argon (Ar), krypton (Kr), and xenon (Xe). In some embodiments, the plasma gas comprises one or more of helium (He), neon (Ne), or argon (Ar).

At 140, positively charged ions of the plasma are accelerated towards the target 256 and sputter material from the target 256. The density of the plasma is increased by placing in back of the target 256 a magnetron 266 having an inner magnetic pole 268 of one magnetic polarity surrounded by an outer magnetic pole 270 of the opposed magnetic polarity. The poles 268, 270 project a magnetic field into the vacuum chamber 252 parallel to the face of the target 256 to trap electrons and hence increase the plasma density and the resultant sputtering rate. To improve the sputtering uniformity and target utilization, the magnetic poles 268, 270 are asymmetric about the central axis 254 but supported on an arm 272 connected to a shaft 274 extending along the central axis 254. A motor 276 rotates the shaft 274 and hence the magnetron 266 about the central axis 254 to provide at least azimuthal uniformity.

In RF sputtering, the alternating nature of the power means the depleted electrons due to ion bombardment are replenished at periodic intervals and the plasma can be sustained. Due to the difference in mobilities of process gas ions and electrons in the plasma at the high frequencies, the target develops a net negative bias and attracts the positive gas ions towards its surface, which sputter the films. This approach involves using oversized chambers to adjust the anode/cathode ratio which dictates the negative self-bias developed on the target. However, RF plasma is difficult to control because magnitude of target self-bias is dependent on anode/cathode ratio and can change with impedance of chamber kits with time. Another approach includes use of pulsed laser deposition technology, which is still best-suited for lab-scale samples and difficult to scale up.

In some embodiments, the signal generator 286 produces pulsed DC sputtering. In some embodiments, the signal generator 286 further comprise process knobs. In some embodiments, the process knobs produce pulsed DC sputtering. In some embodiments, the process knobs comprise one or more of: (A) DC power level (ON); (B) DC power level (OFF); (C) ON pulse width ($T_{ON}$); (D) OFF pulse width ($T_{OFF}$); (E) Duty Cycle ($T_{ON}/(T_{ON}+T_{OFF})$); and (F) Frequency of pulsing ($1/(T_{ON}+T_{OFF})$). In some embodiments, the (A) DC power level (ON), (B) DC power level (OFF), (C) ON pulse width ($T_{ON}$), and (D) OFF pulse width ($T_{OFF}$) are independent variables. In some embodiments, (E) Duty Cycle ($T_{ON}/(T_{ON}+T_{OFF})$) and (F) Frequency of pulsing ($1/(T_{ON}+T_{OFF})$) are dependent on (C) ON pulse width ($T_{ON}$), and (D) OFF pulse width ($T_{OFF}$).

At 150 in FIG. 1, the method 100 comprises depositing a film. FIG. 2 shows a substrate support 280 within the vacuum chamber 252 supports a substrate 282 in opposition to the target 256. The substrate 282 is deposited with the film of a material sputtered from the target 256. In some embodiments, the substrate 282 can be any suitable material known to one skilled in the art. In some embodiments, the substrate comprises glass, sapphire, quartz, $SrTiO_3$, $LaAlO_3$, Si, $SiO_2$-coated Si or combinations thereof. In some embodiments, the substrate comprises any suitable material known to one skilled in the art. In some embodiments, the substrate is maintained at a temperature in a range of from 15° C. to 1000° C., from 50° C. to 1000° C., from 100° C. to 1000° C., from 250° C. to 1000° C., from 500° C. to 1000° C., from 750° C. to 1000° C., from 15° C. to 750° C., from 50° C. to 750° C., from 100° C. to 750° C., from 250° C. to 750° C., from 500° C. to 750° C., from 15° C. to 500° C., from 50° C. to 500° C., from 100° C. to 500° C., from 250° C. to 500° C., from 15° C. to 250° C., from 50° C. to 250° C., from 100° C. to 250° C., from 15° C. to 100° C., from 50° C. to 100° C. or from 15° C. to 50° C.

In some embodiments, a reverse bias source 284 is operatively connected to the substrate support 280. In some embodiments, the reverse bias source 284 is an AC power, a DC power or an RF power. In some embodiments, the substrate support 280 is conductive. In some embodiments, the substrate support 280 acts as an electrode. In some embodiments, the reverse bias source 284 applies reverse bias to the substrate support 280. The negative DC bias on the substrate support 280 causes sputtered ions to accelerate towards the substrate 282 and their trajectories enter deep within any high aspect-ratio holes or features formed in the substrate 282. In some embodiments, the reverse bias is applied in a range of from 0 V to 225 V, 0 V to 200 V, from 20 V to 200 V, from 50 V to 200 V, from 100 V to 200 V, from 150 V to 200 V, from 0 V to 150 V, from 20 V to 150 V, from 50 V to 150 V, from 100 V to 150 V, from 0 V to 100 V, from 20 V to 100 V, from 50 V to 100 V, from 0 V to 50 V, from 20 V to 50 V or from 0 V to 20 V.

Operation of the physical vapor deposition system 200 is controlled by a controller 240. The controller 240 is coupled to one or more of the motor 276, the DC power source 260, the signal generator 286, the wave generator 267 or the mass flow controller 264. In some embodiments, there are more than one controller 240 connected to the individual components and a primary control processor is coupled to each of the separate processors to control the physical vapor deposition system 200. The controller 240 may be one of any form of general-purpose computer processor, microcontroller, microprocessor, etc., that can be used in an industrial setting for controlling various chambers and sub-processors.

The at least one controller 240 can have a processor 242, a memory 244 coupled to the processor 242, input/output devices 246 coupled to the processor 242, and support circuits 248 for communication between the different electronic components. The memory 244 can include one or more of transitory memory (e.g., random access memory) and non-transitory memory (e.g., storage).

The memory 244, or computer-readable medium, of the processor may be one or more of readily available memory such as random access memory (RAM), read-only memory (ROM), floppy disk, hard disk, or any other form of digital storage, local or remote. The memory 244 can retain an instruction set that is operable by the processor 242 to control parameters and components of the physical vapor deposition chamber 200. The support circuits 248 are coupled to the processor 242 for supporting the processor in a conventional manner. Circuits may include, for example, cache, power supplies, clock circuits, input/output circuitry, subsystems, and the like.

Processes may generally be stored in the memory as a software routine that, when executed by the processor, causes the process chamber to perform processes of the present disclosure. The software routine may also be stored and/or executed by a second processor (not shown) that is remotely located from the hardware being controlled by the processor. Some or all of the method of the disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

In some embodiments, the controller 240 has one or more configurations to execute individual processes or sub-processes to perform the method. The controller 240 can be connected to and configured to operate intermediate components to perform the functions of the methods. For example, the controller 240 can be connected to and configured to control one or more of gas valves, actuators, motors, slit valves, vacuum control, etc.

The controller 240 of some embodiments has one or more configurations selected from: a configuration to rotate shaft 274; a configuration to bias the target 256; a configuration to bias the substrate 282; a configuration to apply a waveform to the substrate bias; or a configuration to control the flow of the plasma gas.

At decision 160, the thickness of the deposited film, or number of duty cycles is considered. If the deposited film has reached a predetermined thickness or a predetermined number of duty cycles have been performed, the method 100 moves to an optional post-processing operation 160. If the thickness of the deposited film or the number of duty cycles has not reached the predetermined threshold, the method 100 returns to operation 120, and continuing.

The optional post-processing operation 170 can be, for example, a process to modify film properties (e.g., annealing) or a further film deposition process (e.g., additional ALD or CVD processes) to grow additional films. In some embodiments, the optional post-processing operation 170 can be a process that modifies a property of the deposited film. In some embodiments, the optional post-processing operation 170 comprises annealing the as-deposited film. In some embodiments, annealing is done at temperatures in the range of from 300° C. to 1000° C., from 500° C. to 1000° C., from 800° C. to 1000° C., from 300° C. to 800° C., from 500° C. or 800° C. or from 300° C. to 500° C. The annealing environment of some embodiments comprises one or more of an inert gas (e.g., molecular nitrogen ($N_2$), argon (Ar)) or a reducing gas (e.g., molecular hydrogen ($H_2$) or ammonia ($NH_3$)) or an oxidant, such as, but not limited to, oxygen ($O_2$), ozone ($O_3$), or peroxides. In one or more embodiments, the oxidant comprises complex oxides. In some embodiments, the complex oxides comprises $BaTiO_3$. Annealing can be performed for any suitable length of time. In some embodiments, the film is annealed for a predetermined time in the range of from 15 seconds to 6 hours, from 1 minute to 6 hours, from 30 minutes to 6 hours, from 1 hour to 6 hours, from 2 hours to 6 hours, from 4 hour to 6 hours, from 15 seconds to 4 hours, from 1 minute to 4 hours, from 30 minutes to 4 hours, from 1 hour to 4 hours, from 2 hours to 4 hours, from 15 seconds to 2 hours, from 1 minute to 2 hours, from 30 minutes to 2 hours, from 1 hour to 2 hours, from 15 seconds to 1 hour, from 1 minute to 1 hour, from 30 minutes to 1 hour, from 15 seconds to 30 minutes, from 1 minute to 30 minutes or from 15 seconds to 1 minute. In some embodiments, annealing the as-deposited film increases the density, increases the resistivity, decreases the resistivity and/or increases the purity of the film. In one or more embodiments, annealing can also with performed with a gas under plasma. In one or more embodiments, annealing the as-deposited film in the presence of a complex oxides decreases the resistivity of the film. In one or more embodiments, annealing the as-deposited film in the presence of a complex oxides decreases number of oxygen vacancies.

In one or more embodiments, the method 100 is run in a power mode with power being the set-points. In one or more embodiments, the method 100 is run in a current mode with current being the set-points. In one or more embodiments, the method 100 is run in a voltage mode with voltage being the set-points. In one or more embodiments, the method 100 is run in a power, a current or a voltage mode, with power, current or voltage being the set-points, respectively.

In one or more embodiments, the plasma may be generated remotely or within the processing chamber. In one or more embodiments, the plasma is an inductively coupled plasma (ICP) or a conductively coupled plasma (CCP). Any suitable power can be used depending on, for example, the reactants, or the other process conditions. In some embodiments, the plasma is generated with a plasma power in the range of from 10 W to 3000 W. In some embodiments, the plasma is generated with a plasma power less than or equal to 3000 W, less than or equal to 2000 W, less than or equal to 1000 W, less than or equal to 500 W, or less than or equal to 250 W.

In some embodiments, the dielectric film formed comprises dielectric. In some embodiments, the dielectric film consists essentially of dielectric. As used in this manner, the term "consists essentially of dielectric" means that the dielectric film has greater than or equal to 80%, 85%, 90%, 95%, 98%, 99% or 99.5% of dielectric on an volume basis. Measurements of the composition of the dielectric film refer to the bulk portion of the film, excluding interface regions where diffusion of elements from adjacent films may occur.

One or more embodiments of the disclosure are directed to methods of depositing dielectric films in high aspect ratio features. A high aspect ratio feature is a trench, via or pillar having a height:width ratio greater than or equal to 10, 20, or 50, or more. In some embodiments, the dielectric film is deposited conformally on the high aspect ratio feature. As used in this manner, a conformal film has a thickness near the top of the feature that is in the range of 80-120% of the thickness at the bottom of the feature.

Some embodiments of the disclosure are directed to methods for bottom-up gapfill of a feature. A bottom-up gapfill process fills the feature from the bottom versus a conformal process which fills the feature from the bottom and sides. In some embodiments, the feature has a first material at the bottom and a second material at the sidewalls. The dielectric film deposits selectively on the first material relative to the second material so that the metal film fills the feature in a bottom-up manner.

Embodiments of the disclosure pertain to a deposition system, for example a physical vapor deposition ("PVD") chamber. In one or more embodiments, the PVD chamber comprising at least one cathode assembly, and in particular embodiments, a PVD chamber comprising multiple cathode assemblies (referred to herein as a "multi-cathode chamber").

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of depositing a dielectric film in a high aspect ratio feature of a semiconductor substrate, the method comprising:
applying power to a dielectric target within a vacuum chamber to generate a plasma in a process gap between the dielectric target and a substrate support, the power being a pulsed DC power having pulsed DC waveform, the pulsed DC waveform comprising a plurality of ON pulses and a plurality of OFF pulses, each of the ON pulses and the OFF pulses independently being in a range of from 1 µs to 50 µs, a voltage of the plurality of ON pulses being in a range of from greater than 9 V to 1500V, the pulsed DC waveform being generated at a frequency in a range of from 10 KHz to 500 kHz, and the pulsed DC waveform having a duty cycle in a range of from greater than 0 to less than 0.6;
pulsing the power applied to the dielectric target to prevent charge accumulation; and
applying a reverse bias to the substrate support using a reverse bias source, wherein the reverse bias source is AC power, DC power, or RF power, and wherein the reverse bias source is not pulsed,
the high aspect ratio feature having a height:width ratio greater than or equal to 10:1.

2. The method of claim 1, wherein the dielectric target comprises one or more of lead zirconate titanate (PZT), lead magnesium niobate-lead titanate (PMN-PT), aluminium oxide ($Al_2O_3$) or lithium niobate ($LiNbO_3$).

3. The method of claim 1, wherein the target is maintained at a temperature in the range of from 0° C. to 60° C.

4. The method of claim 1, wherein generating the plasma comprises supplying a plasma gas into the process gap.

5. The method of claim 4, wherein the plasma gas flows from a gas source through a mass flow controller into the process gap.

6. The method of claim 4, wherein the plasma gas is supplied at a flow rate in the range of from 2 sccm to 100 sccm.

7. The method of claim 4, wherein the plasma gas maintains a pressure inside the process gap in the range of from 1 milliTorr to 30 milliTorr.

8. The method of claim 4, wherein the plasma gas comprises one or more of helium (He), neon (Ne), argon (Ar), krypton (Kr) or Xenon (Xe).

9. The method of claim 1, wherein the substrate comprises glass, sapphire, quartz, SrTiO$_3$, LaAlO$_3$, silicon (Si), silicon oxide coated silicon, or combinations thereof.

10. The method of claim 1, wherein the reverse bias is applied in a range of from 0 V to 225 V.

\* \* \* \* \*